United States Patent [19] | [11] Patent Number: 4,795,300
Tomaselli et al. | [45] Date of Patent: Jan. 3, 1989

[54] LOADING APPARATUS FOR A WORK CHAMBER

[75] Inventors: Dominick Tomaselli, Huntington Station, N.Y.; Hans-Michael Hoehle, Ladenburg, Fed. Rep. of Germany

[73] Assignee: The Perkin-Elmer Corporation, Norwalk, Conn.

[21] Appl. No.: 145,939

[22] Filed: Jan. 20, 1988

[51] Int. Cl.$^4$ .................. B65G 65/00; F16C 32/06
[52] U.S. Cl. .................................. 414/217; 414/223
[58] Field of Search ............... 414/217, 219, 220, 222, 414/223, 225

[56] References Cited

U.S. PATENT DOCUMENTS

| | | | |
|---|---|---|---|
| 3,080,074 | 3/1963 | Hornbostel | 414/217 |
| 3,839,618 | 10/1974 | Muehlberger | 219/121 |
| 4,544,317 | 10/1985 | Carter | 414/217 |
| 4,548,699 | 10/1985 | Hutchinson et al. | 414/217 X |

*Primary Examiner*—Robert J. Spar
*Assistant Examiner*—Stuart J. Millman

*Attorney, Agent, or Firm*—H. S. Ingham; F. L. Masselle; E. T. Grimes

[57] ABSTRACT

An apparatus for loading workpieces without exposure of a work chamber to the atmosphere comprises a transfer chamber formed in part by an inner plate section which serves as a cover plate with an inner port therethrough to the work chamber. An entry plate section has an entry port therethrough to the atmosphere, is spaced laterally from the inner port and has a door. A plurality of tubular loading members are equally spaced arcuately in a wheel member mounted in the transfer chamber. Each loading member is displaceable at a loading site between a normal position in the wheel in which each loading member is relocatable laterally by the wheel, and a sealed position proximate the entry port. A seal between the entry plate section and the loading member in its sealed position allows access of a workpiece to the loading cylinder through the entry port without exposing the remainder of the transfer chamber to the atmosphere. The inner end of each loading member may be sealed permanently or, optionally, a disk selectively seals closed the inner end of each loading member at the loading site.

13 Claims, 3 Drawing Sheets

LOADING APPARATUS FOR A WORK CHAMBER

This invention relates to an apparatus for loading workpieces into and out of a work chamber without exposure of the work chamber to the atmosphere.

BACKGROUND OF THE INVENTION

Various industrial operations such as coating applications are effected in a chamber filled with inert gas which, quite frequently, is held at sub-atmospheric pressure. Such controlled atmosphere operations include chemical and vapor deposition processes, election beam welding and the like. Another process requiring a chamber is the coating of parts, e.g., turbine blades, by means of plasma spraying in low pressure inert atmosphere as described, for example, in U.S. Pat. No. 3,839,618.

Practical utilization of such a work chamber requires some efficiency in the loading and unloading of workpieces into and out of the chamber. Simply opening up the chamber to change workpieces may be acceptable in the laboratory but is slow in commercial operations because of the time needed for repumping and, in some cases, degassing to eliminate contaminants.

Use of a vacuum interlock is common, involving a smaller auxiliary chamber attached to the main work chamber with an inner door therebetween. The auxiliary chamber is opened with another door to the atmosphere, a workpiece is placed inside, the auxiliary chamber is closed and pumped down, the inner door is opened and the workpiece moved into the work chamber. The process is reversed for removal and then the cycle is repeated for additional workpieces. Since only one workpiece can be handled at a time, such vacuum interlocks are still quite slow to use. An additional problem is the extra time that may be required for the workpiece to cool after being heated during an operation such as plasma spray coating. Cooling may be necessary before opening to the atmosphere to avoid high temperature oxidation and to allow handling.

Other resolutions to the loading problem include the loading of a number of workpieces on a magazine in the work chamber. This approach has been suitable for certain types of operations such as vapor deposition where a large number of workpieces may be coated simultaneously, or where parts are small and/or easily handled. However, magazines loaded with a large number of parts are not very practical for complex coating operations such as plasma spray coating since considerable volume would be required and the standby workpieces would be subjected to contamination from the dust and side spray of the coating process.

Continuous conveyor systems are also utilized. These require a series of heavily pumped auxiliary chambers in tandem at each side, in and out. Danger of air contamination exists because the system is open to air through the auxiliary chambers.

Therefore, an object of the present invention is to provide a novel loading apparatus for a work chamber which allows continual processing of workpieces while attaining improved efficiencies in the loading and unloading of the workpieces.

A further object is to provide a loading apparatus for a work chamber operating with a controlled atmosphere, which allows loading and unloading of a workpiece while simultaneously processing another workpiece in the work chamber, with a minimal volume requirement for evacuating and/or replacing gas.

Another object is to provide a magazine type of loading apparatus suitable for a work chamber operating with a controlled atmosphere, which can be loaded and unloaded with a minimal volume requirement for evacuating and/or replacing gas.

Yet another object is to provide a loading apparatus for a work chamber in which workpieces are heated in a controlled atmosphere, which allows cooling time for a heated workpiece in the controlled atmosphere during subsequent operations in the work chamber and simultaneous reloading of other workpieces.

BRIEF DESCRIPTION OF THE INVENTION

The foregoing and other objects of the present invention are achieved with a loading apparatus associated with a work chamber such as a sub-atmospheric inert gas chamber for plasma spray coating. A transfer chamber is formed in part by an inner plate section adapted as a cover plate for the work chamber, the inner plate section having an inner port therethrough to the work chamber. An entry plate section of the transfer chamber has an entry port therethrough to the atmosphere, the entry port being spaced laterally from the inner port. A door means selectively closes the entry port to seal the transfer chamber from the atmosphere. At least one tubular loading member is located in the transfer chamber, each having an open loading end and an inner end.

A transport means, preferably a wheel member, holds each loading member and can relocate the same laterally so as to align each loading member alternatively with the entry port at a loading site or with the inner port at a unloading site. According to the present invention each loading member is held loosely with respect to the transport means such as to be displaceable at the loading site between a normal position in which each loading member is relocatable laterally by the transport means and a sealed position proximate the entry port. Retaining means such as a spring normally retains each loading member in its normal position. A displacement means displaces a loading member at the loading site between its normal position and its sealed position. A closure means seals closed the inner end of each loading member at least while said each loading member is in its sealed position. A sealing means seals between the entry plate section and the loading end of the loading member in its sealed position, to allow access of a workpiece to the loading cylinder in its sealed position through the entry port with the door open without exposing the remainder of the transfer chamber to ambient atmosphere.

Upon relocation of a loaded loading member by the wheel member the workpiece is transferred through the inner port between the work chamber and the loading member at the loading site. The loading apparatus may further comprise means for maintaining subatmospheric pressure in the transfer chamber, means for pressurizing the inside of the loading member in its sealed position to ambient atmosphere while the door is closed, and means for subsequently evacuating to sub-atmospheric pressure the inside of the loading member in its sealed position while the door is closed. Preferably a first loading member is at the unloading site while a second loading member is at the loading site. Most desirably a third loading member is situated between the two sites, for cooling or the like.

In one embodiment the closure means comprises a permanent end wall at the inner end of each loading member, and the inner plate section and the entry plate section together constitute a single plate component of the transfer chamber. Thus the access through the entry port and the transfer through the inner port are each effected at a common side of the transfer chamber.

In an alternative embodiment the inner end of each loading member is normally open. The closuure meas comprises a sealing member, such as a disk with a seal therein, at the loading site disposed proximate the inner end of the loading member. The sealing member has a normal setting free of the loading member and a sealed setting against the loading member. A displacement means comprises urging means such as a linearly actuated rod for urging the sealing member from the normal setting to the sealed setting such as to sealingly close the inner end of the loading member at the loading site and simultaneously to displace the loading member at the loading site from its normal position to its sealed position. The loading member, the sealing member and the sealing means cooperatively allow access of a workpiece to the loading cylinder in its sealed position through the entry port with the door open without exposing the remainder of the transfer chamber to the atmosphere.

DETAILED DESCRIPTION OF THE INVENTION

Figure 1:
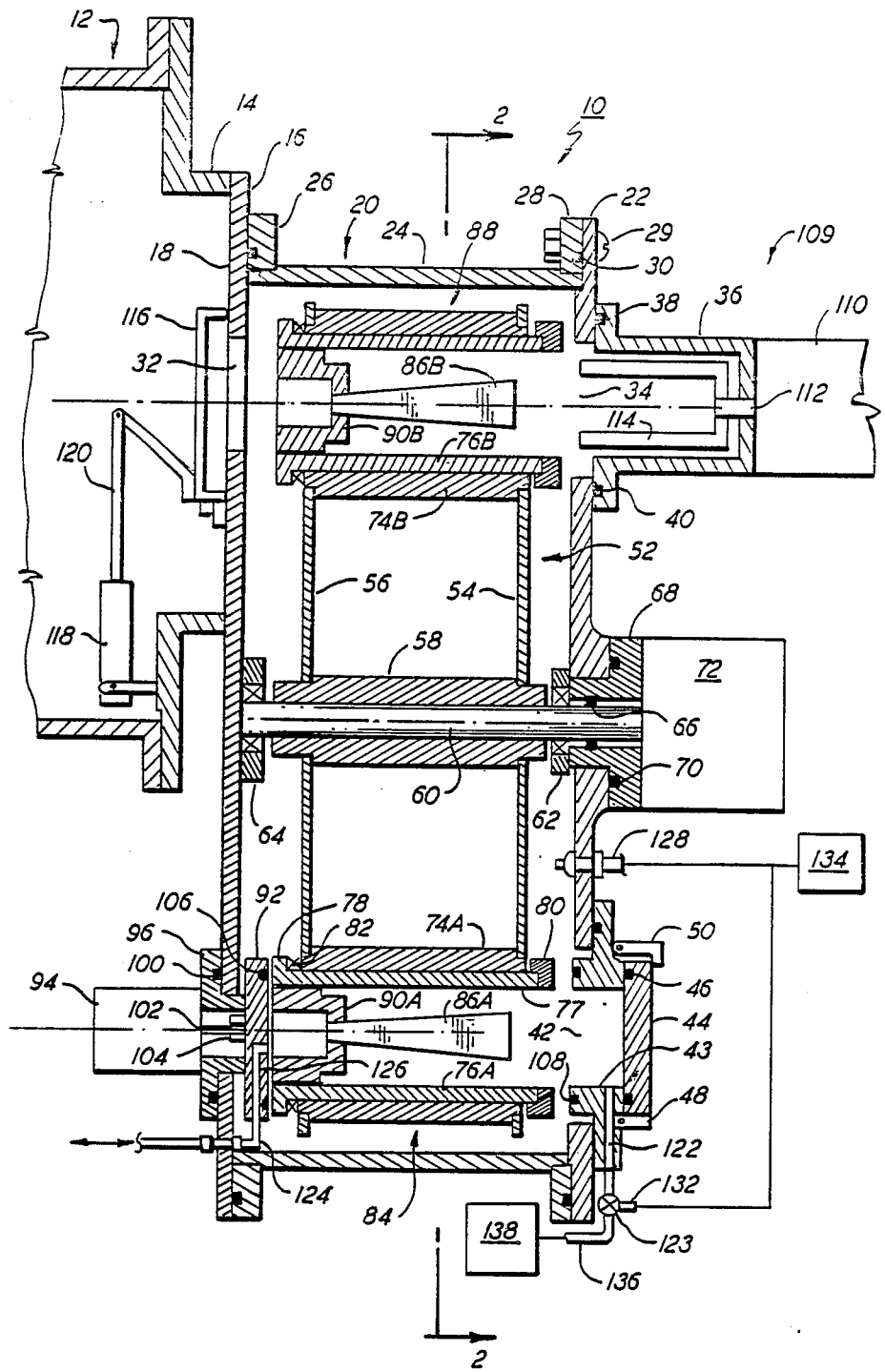
FIG. 1 is a cross-sectional view of a loading apparatus according to the present invention.

An embodiment of a loading apparatus 10 according to the present invention, illustrated in FIG. 1, is attached to a portion of a work chamber shown at 12. The work chamber generally may be utilized for controlled gas conditions; for example, for plasma spraying of coatings onto workpieces in low pressure inert gas.

An objective of loader 10 is to allow efficient transfer of workpieces, e.g., for being coated, into and out of the work chamber without entry of the ambient air of the atmosphere into the chamber, and without excessive pumping volume during the transfer process.

The portion of chamber 12 shown in FIG. 1 includes a ring-shaped bell cover 14. The loading apparatus 10 includes an inner plate component 16 with an inner plate section 18 thereof that is adapted as a cover plate for chamber 12, being mounted onto the open end of the bell cover 14. Inner plate 16 also forms one wall of a transfer chamber 20.

Outer plate 22 forms a second, opposing wall of the transfer chamber. The outer plate is substantially the same size as inner plate 16 and is spaced parallel to the inner plate by a drum 24. The drum has two flanges 26,28 attached by bolts 29 to plates 16,22 respectively with o-rings 30 therebetween so that the transfer chamber 20 is in vacuum tight condition. An inner port 32 extends through inner plate 16 to work chamber 12. Outer plate 22 may have a similar outer port 34 aligned with inner port 32, in which case a cylindrical housing 36 with a flange 38 and an o-ring seal 40 is bolted to outer plate 22 over the outer port 34.

Arcuately spaced from and preferably diametrically opposite the inner and outer ports 32,34 is an entry port 42 in an annular door mount 43 on outer plate 22. A door 44 with an o-ring 46 is mounted on a hinge 48 over the entry port and can be selectively fastened closed with a hinged fastener 50, to seal closed transfer chamber 20 from the ambient atmosphere.

A rotatable wheel member 52 is mounted in the transfer chamber 20 and comprises a pair of disks 54,56 axially engaged a tubular shaft 58 containing an axle 60 journaled in a pair of bearings 62,64. The axle extends through an o-ring seal 66 in a mounting ring 68 attached to outer plate 22, an o-ring seal 70 also being between axle 60 and mounting ring 68. A motor 72 coupled to the axle drives wheel 52 to various selected positions.

One, or preferably a plurality, of retaining cylinders are attached between wheel disks 54,56. Two such cylinders are shown at 74A,74B diametrically opposite each other. As indicated further in FIG. 2, other cylinders 74C,74D such as may, for example, total four (collectively designated 74 herein) are arcuately and equally spaced in the wheel.

Figure 2:
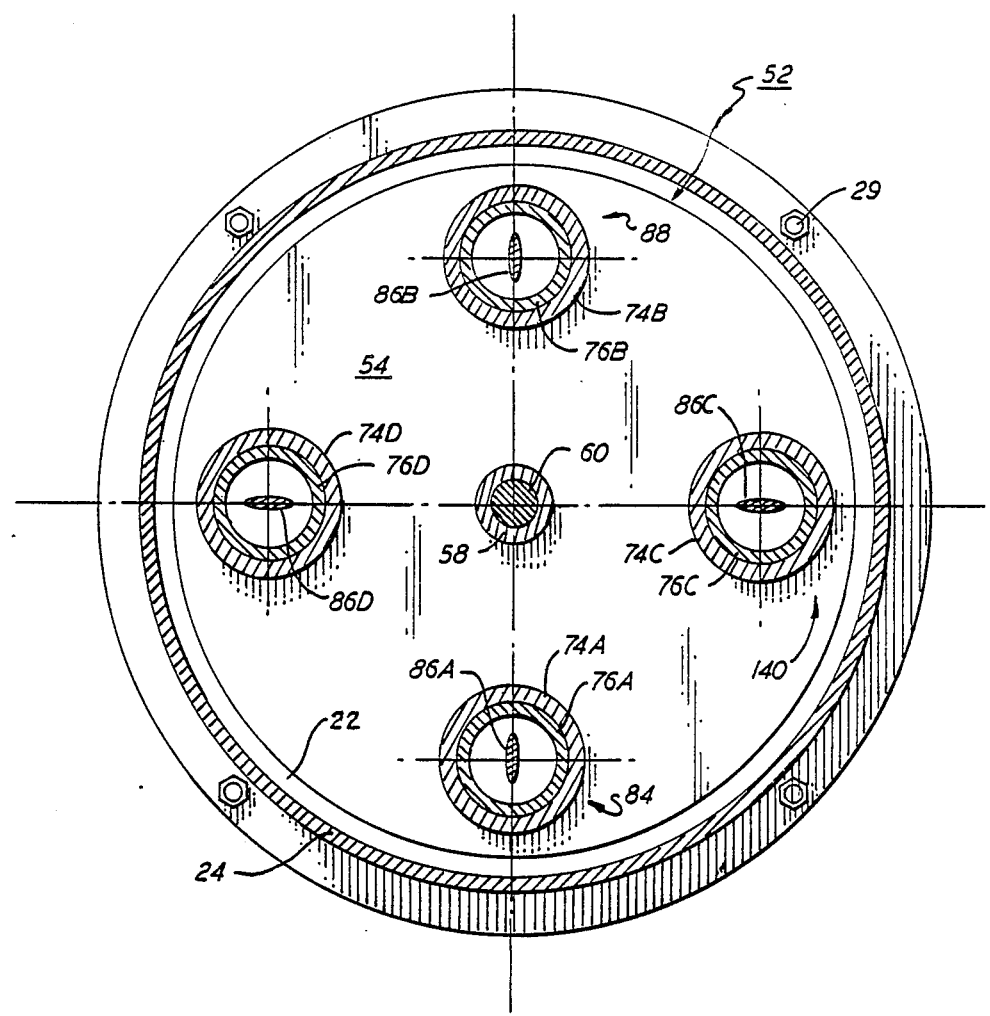
FIG. 2 is a transverse-sectional view in the direction of the arrows along the line 2—2 in FIG. 1.

One each of a plurality of tubular loading members 76A,76B,76C,76D (collectively 76 herein) is held loosely, vis. slidingly, in each respective retaining cylinder 74. Each member 76 is formed of a tubular wall 77 with an inner flange 78 and an outer flange 80 spaced such as to allow a short axial displacement of member 76 in a corresponding retaining cylinder 74. Retaining means, such as a spring 82 in compression, is interposed between inner flange 78 and retaining cylinder 74 to normally retain loading member 76 at a normal position in the cylinder. "Normal" position is such that allows wheel member 52 to rotate freely. A loading member 76A aligned coaxially with entry port 42 is at a loading site 84 so that a workpiece 86A may be loaded into or out of the loading member with door 44 open. Similarly another (or same, relocated) loading member 76B which is aligned coaxially with inner port 32 is at an unloading site 88, where a workpiece 86B is in position to be transferred between loading member 76B and work chamber 12. Thus, with a plurality of loading members the wheel assembly is essentially a magazine type of loading apparatus (FIG. 2). Workpieces 86A,86B may be attached respectively to mountings 90A,90B that position the workpieces in the loading member and are readily gripped for transfer.

In the embodiment of FIG. 1, a sealing member in the form of a disk 92 is disposed near inner plate 16 axially opposite entry port 42. The disk also is proximate inner flange 78 at the inner end of loading cylinder 76A positioned at loading site 84. An air actuated plunger device 94 or the like is attached to a mounting ring 96 which with screws (not shown) and an o-ring 100 is sealed to the outside of plate 16 axially opposite entry port 42. A rod 102 from device 94 engages a connector 104 on disk 92 and generally retains the disk in one of two selected settings. In a normal setting the disk is lifted away from inner flange 98 and wheel member 52 is free to rotate.

When device 94 is actuated rod 102 urges disk 92 against inner flange 78 and the disk moves to a sealed setting that, with an o-ring 106 in the disk, sealingly closes the inner end of loading member 76A. Simultaneously the urging force against the disk displaces the loading member against spring 82 away from its normal position toward entry port 42. An o-ring seal 108 inside of door mount 43 at the entry port seals against flange 80 at the outer (loading) end of the loading member 76A to cause the inside of the loading member to be sealed from the remainder of the inside of transfer chamber 20. Thus, since the inner end of member 76A is also sealed against disk 92, door 44 may be opened and access for workpiece 86A into or out of member 76A is attained without allowing ambient air into the transfer chamber or the work chamber, thereby allowing sub-atmospheric pressure and/or inert or other special gas conditions to be maintained.

With a workpiece loaded into the loading member, wheel 52 is rotated by motor 72 to relocate the workpiece to unloading site 88 at inner port 32. A convenient transfer device 109 for transferring the workpiece into the work chamber includes housing 36 and a compressed air driven linear actuator 110 or the like mounted on the housing. The actuator pushes or pulls an arm member 112 through loading member 76B and the inner port. Gripping means, such as a positive action collet 114 on the end of the arm, engages the workpiece and moves it into or out of the work chamber. Simultaneously another loading chamber is at loading site 84 where a processed workpiece may be unloaded and a next workpiece reloaded.

Auxiliary features are included as needed. For example, a shield 116 over inner port 30 may be utilized for protecting components in the transfer chamber from spray dust. This may be operated with another actuator 118 and a pair of hinged arms 120. Also, vacuum and/or gas, for quick evacuation and pressurization, is applied to loading member 76A in its loading position. This may be through a duct 122 in door mount 43 with a three-way valve 123 connecting through line 132 to a pump 130 and through line 136 to a gas source 138; or through a flexible tube 124 and an alternative duct 126 in disk 54. Transfer chamber 20 is typically held at work chamber pressure through inner port 32 but, optionally, may be evacuated or the like through a pipe 128 in one wall to pump 130.

Figure 3:
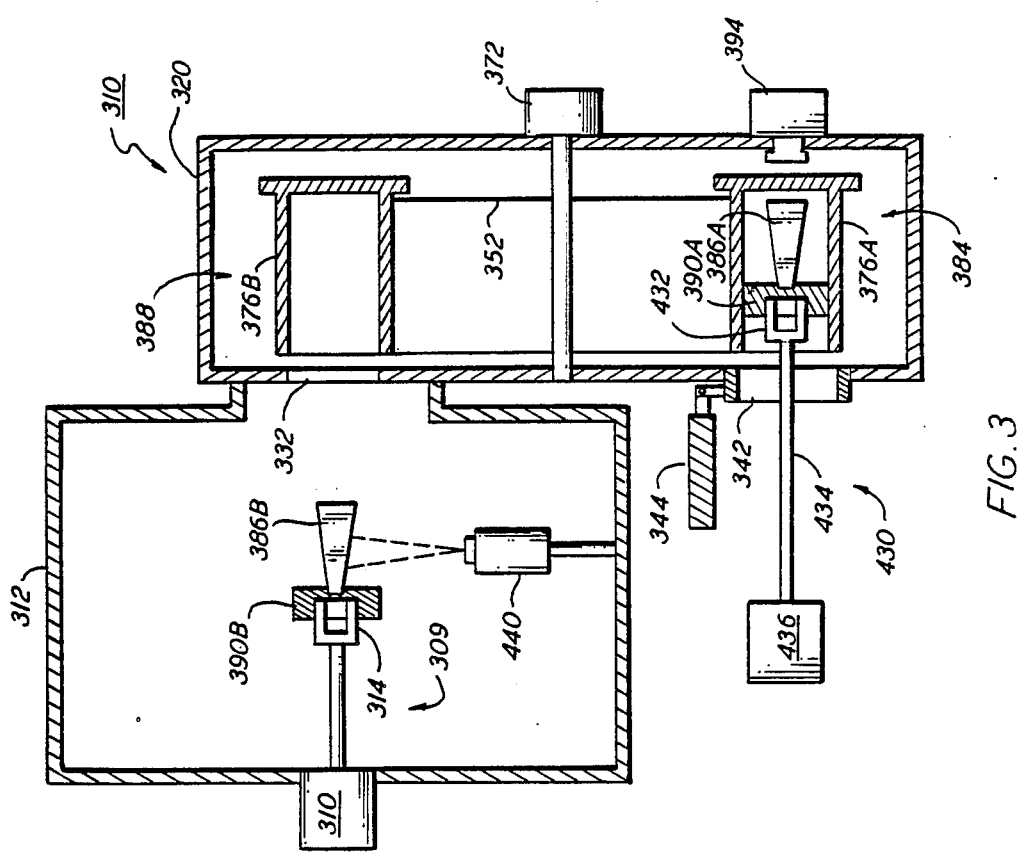
FIG. 3 is a schematic cross-sectional view of a work chamber and a loading apparatus according to a further embodiment of the present invention.

In an alternative embodiment of the present invention each loading member is permanently closed at one end. FIG. 3 shows an overall schematic sectional view of such a loading apparatus 310 on a work chamber 312. The loading apparatus includes a transfer chamber 320 containing a wheel member 352 with a drive motor 372 and a pair of tubular loading members 376A,376B one each at a loading site 384 and an unloading site 388 respectively. A loading mechanism 430 includes gripping means, such as a positive action collet 432 on the end of an arm 434, which engages a mounting 390A for a workpiece 386A and moves it into or out of the loading member. FIG. 3 shows the mounting being gripped through an open door 344 and an entry port 342. The arm may be associated with a robot or the like (shown schematically at 436). Alternatively workpieces may be loaded and unloaded by hand.

Work chamber 312 has associated with it a transfer device 309 including a collet 314 on an arm with a linear actuator 310, which can transfer workpieces through an inner port 332. A plasma gun 440 is also shown in FIG. 3 spray coating a workpiece 36B on its mounting 390B held by the collet. Actuator 310, in this case, also rotates and translates the workpiece during the coating operation.

Figure 4:
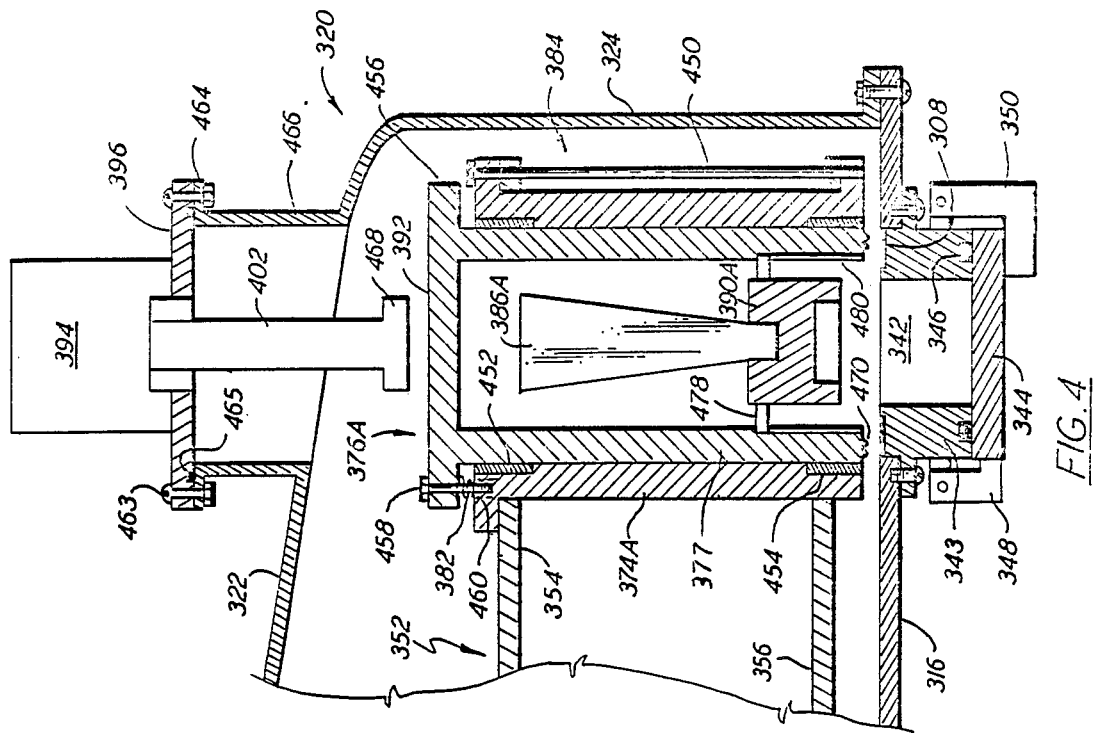
FIG. 4 is a detailed cross-sectional view of a portion of the apparatus of FIG. 3.

FIG. 4 details the embodiment of FIG. 3 at the loading site 384. There are shown portions of transfer chamber 320 comprising an inner plate 316, an outer plate 322, and a drum portion 324, and also an entry port 342 with a door 344 on an annular door mount 343, and a wheel member 352. The door is on a hinge 348 and has an O-ring seal 346 and a door fastener 350. A retaining cylinder 374A is held in a pair of wheel disks 354,356 which are supported with a plurality of threaded rods (one shown at 450). Two sleeve guides 452,454 are recessed inside cylinder 374A near the ends.

A tubular loading member 376A is held slidingly in the pair of guides 452,454. The loading member is formed of a tubular wall 377 sealed permanently closed at its inner end by a fixed end wall formed by a disk 392 with a positioning flange 456 extending radially beyond tubular wall 377 of member 376A. Three equally spaced cap pins (one shown at 458) extend slidingly through corresponding holes in flange 456 and are affixed by threading 460 into the end of retaining cylinder 374A. The cap pins have a length such as to allow a short axial displacement of the loading member in the retaining cylinder. A spring 382 is installed in compression on each cap pin between flange 456 and retaining cylinder 374A to normally retain loading member 376A at a normal position in the cylinder, as shown.

An air actuated plunger device 394 is sealed to a mounting ring 396 attached in turn by screws 463 and with an o-ring 465 to a flange 464 on a cylindrical extension 466 from outer plate 322. A rod 402 from the device has broadened end 468 that can press against end disk 392 of the loading member.

The urging force of rod 402 against end disk 392 displaces loading member 376A toward loading port 342 against spring 382 and away from its normal position. A washer-shaped seal 308 in door mount 343 at the loading port becomes engaged by a concentric pair of annular V-shaped protrusions 470 at the outer (loading) end of member 376A to cause the inside of the loading member to be sealed from the remainder of the inside of transfer chamber 320. Thus door 344 may be opened and access for a workpiece 386A on a mounting 390A into or out of the loading member is attained without allowing ambient air into the transfer chamber 320 or the work chamber 312 (FIG. 3), thus allowing subatmospheric pressure and/or inert or other special gas conditions to be maintained. Mounting 390A may be engaged into the loading member with a pair of mounting pins 478 rotated into slots 480 in tubular wall 377.

It is highly desirable for operating efficiency for the wheel with the loading members according to the present invention to be arranged cooperatively with the loading site and the unloading site so that one loading member is at the unloading site while a second loading member is at the loading site as shown in FIGS. 1, 2 and 3. Where the work chamber is a plasma spray coating chamber or the like, resulting in workpieces being heated, it is further desirable to have in the wheel at least three loading members, and preferably four as shon in FIG. 2. This arrangement allows a workpiece just removed from the work chamber to be rotated to and held in a cooling site 140 while other workpieces are being processed at the loading and unloading sites. Cooling in the transfer chamber is desirable to prevent effects of premature exposure to air and for ease of handling at the loading port.

While the invention has been described above in detail with reference to specific embodiments, various changes and modifications which fall within the spirit of the invention and scope of the appended claims will become apparent to those skilled in this art. The invention is therefore only intended to be limited by the appended claims or their equivalents.

What is claimed is:

1. A loading apparatus for loading workpieces into and out of a work chamber without exposure of the work chamber to the atmosphere, comprising:

a transfer chamber formed in part by an inner plate section adapted as a cover plate for a work chamber and having an inner port therethrough to the work chamber, and by a entry plate section having an entry port therethrough to the atmosphere, the entry port being spaced laterally from the inner port;

door means for selectively closing the entry port to seal the transfer chamber from the atmosphere;

at least one tubular member located in the transfer chamber, each having an open loading end and an inner end;

transport means for relocating each loading member laterally so as to align each loading member alternatively with the entry port at a loading site or with the inner port at an unloading site, each loading member being held loosely with respect to the transport means such as to be displaceable at the loading site between a normal position in which each loading member is relocatable laterally by the transport means and a sealed position proximate the entry port;

retaining means for normally retaining each loading member in its normal position;

displacement means for displacing a loading member at the loading site between its normal position and its sealed position;

closure means for sealing closed the inner end of each loading member at least while each loading member is in its sealed position; and sealing means for sealing between the entry plate section and the loading end of the loading member in its sealed position, such as to allow access of a workpiece to the loading cylinder in its sealed position through the entry port with the door open without exposing the remainder of the transfer chamber to ambient atmosphere.

2. A loading apparatus according to claim 1 further comprisng transfer means for transferring the workpiece between the work chamber and the loading member at the loading site through the inner port.

3. A loading apparatus according to claim 2 further comprising mounting means for mounting the workpiece cooperatively with the loading member to retain the workpiece in the loading member, wherein the transfer means comprises gripping means for gripping the mounting means.

4. A loading apparatus according to claim 1 wherein the work chamber is a sub-atmospheric pressure chamber and the loading apparatus further comprises means for maintaining sub-atmospheric pressure in the transfer chamber, means for pressurizing the inside of the loading member in its sealed position to the atmosphere while the door is closed, and means for subsequently evacuating to sub-atmospheric pressure the inside of the loading member in its sealed position while the door is closed.

5. A loading apparatus according to claim 4 wherein the sub-atmospheric pressure chamber is a plasma spray coating chamber.

6. A loading apparatus according to claim 1 wherein the at least one tubular loading member comprises a plurality of loading members cooperatively arranged with the transport means, the loading site and the unloading site such that a first loading member is at the unloading site while a secod loading member is at the loading site.

7. A loading member according to claim 6 wherein the plurality of loading members comprises at least three loading members arranged such that a third loading member is at a cooling site while the first and second loading members are at the unloading and loading sites respectively.

8. A loading apparatus according to claim 1 wherein the transport means comprises a rotatable wheel member mounted in the transfer chamber and drive means for rotating the wheel member to relocate each loading member between the loading site and the unloading site, and the at least one loading member comprises a plurality of loading members equally spaced arcuately in the wheel member.

9. A loading apparatus according to claim 1 wherein the closure means comprises a fixed end wall at the inner end of each loading member, and the inner plate section and the entry plate section together constitute a single plate component of the transfer chamber, whereby the access through the entry port and the transfer through the inner port are each effected at a common side of the transfer chamber.

10. A loading apparatus according to claim 1 wherein the inner end of each loading member is normally open, the closure means comprises a sealing member at the loading site disposed proximate the inner end of the loading member at the loading site, the sealing member has a normal setting free of the loading member and a sealed setting against the loading member, and the displacement means comprises urging means for urging the sealing member from the normal setting to the sealed setting such as to sealingly close the inner end of the loading member at the loading site and simultaneously displace the loading member at the loading site from its normal position to its sealed position, whereby the loading member, the sealing member and the sealing means cooperatively allow access of a workpiece to the loading cylinder in its sealed position through the entry port with the door open without exposing the remainder of the transfer chamber to the atmosphere.

11. A loading apparatus according to claim 10 further comprising mounting means for mounting the workpiece cooperatively with the loading member to retain the workpiece in the loading member, and transfer means for transferring the workpiece through the inner port including an arm member with an inner end extendable into the work chamber through the loading member at the unloading site by way of the loading end of said loading member, and further including gripping means attached to the inner end for gripping the mounting means.

12. A loading apparatus for loading workpieces into and out of a work chamber without exposure of the work chamber to the atmosphere, comprising:

a transfer chamber formed in part by a plate component with an inner plate section and a entry plate section, the inner plate section being adapted as a cover plate for a sub-atmospheric pressure work chamber and having an inner port therethrough to the work chamber, and the entry plate section having an entry port therethrough to the atmosphere, with the entry port being spaced laterally from the inner port;

door means for selectively closing the entry port to seal the transfer chamber from the atmosphere;

a rotatable wheel member mounted in the transfer chamber;

a plurality of tubular loading members equally spaced arcuately in the wheel member and cooperatively arranged with the wheel member, the loading site and the unloading site such that a first loading member is at the loading site while a second loading member is at the unloading site, each loading member having an open loading end and a closed end;

drive means for rotating the wheel member so as to relocate each loading member laterally to align each loading member alternatively with the entry port at a loading site and with the inner port at an unloading site, each loading member being held loosely with respect to the wheel member such as to be displaceable at the loading site between a normal position in which each loading member is relocatable laterally by the wheel member and a sealed position proximate the entry port;

retaining means for normally retaining each loading member in its normal position;

displacement means for displacing a loading member at the loading site between its normal position and its sealed position;

sealing means for sealing between the entry plate section and the loading end of the loading member in its sealed position, such as to allow access of a workpiece to the loading cylinder in its sealed position through the entry port with the door open without exposing the remainder of the transfer chamber to ambient atmosphere; and pressure means for maitaining sub-atmospheric pressure in the transfer chamber, pressurizing the inside of the loading member in its sealed position to the atmosphere while the door is closed, and subsequently evacuating to sub-atmospheric pressure the inside of the loading member in its sealed position while the door is closed.

13. A loading apparatus for loading workpieces into and out of a work chamber without exposure of the work chamber to the atmosphere, comprising:

a transfer chamber formed in part by an inner plate section adapted as a cover plate for a sub-atmospheric pressure work chamber and having an inner port therethrough to the work chamber, and a entry plate section having a entry port therethrough to the atmosphere, with the entry port being spaced laterally from the inner port;

door means for selectively closing the entry port to seal the transfer chamber from the atmosphere;

a rotatable wheel member mounted in the transfer chamber;

a plurality of tubular loading members equally spaced arcuately in the wheel member and cooperatively arranged with the wheel member, the loading site and the unloading site such that a first loading member is at the unloading site while a second loading member is at the loading site, each loading member having a normally open loading end and a normally open inner end;

drive means for rotating the wheel member so as to relocate each loading member laterally to align each loading member alternatively with the entry port at a loading site and with the inner port at an unloading site, each loading member being held loosely with respect to the transport means such as to be displaceable at the loading site between a normal position in which each loading member is relocatable laterally by the transport means and a sealed position proximate the entry port;

retaining means for normally retaining each loading member in its normal position;

closure means for selectively sealing closed the inner end of each loading member, comprising a sealing member at the loading site disposed proximate the inner end of the loading member at the loading site, the sealing member having a normal setting free of the loading member and a sealed setting against the loading member;

displacement means for displacing the loading member at the loading site between its normal position and its sealed position, comprising urging means for urging the sealing member from the normal setting to the sealed setting such as to sealingly close the inner end of the loading member at the loading site and simultaneously displace the loading member at the loading site from its normal position to its sealed position;

sealing means for sealing between the entry plate section and the loading end of the loading member in its sealed position, the loading member, the sealing member and the sealing means cooperatively allowing access of a workpiece to the loading cylinder in its sealed position through the entry port with the door open without exposing the remainder of the transfer chamber to the atmosphere;

pressure means for maintaining sub-atmospheric pressure in the transfer chamber, pressurizing the inside of the loading member in its sealed position to ambient atmosphere while the door is closed, and subsequently evacuating to sub-atmospheric pressure the inside of the loading member in its sealed position while the door is closed;

mounting means for mounting the workpiece cooperatively with the loading member to retain the workpiece in the loading member; and transfer means for transferring the workpiece through the inner port, including an arm member with an inner end extendable into the work chamber through the loading member at the unloading site by way of the loading end of said loading member, and further including gripping means attached to the inner end for gripping the mounting means.

* * * * *